United States Patent [19]

Chu et al.

[11] 4,292,644
[45] Sep. 29, 1981

[54] CONTROL OF VALLEY CURRENT IN A UNIJUNCTION TRANSISTOR BY ELECTRON IRRADIATION

[75] Inventors: Hing C. Chu; Y. S. Edmund Sun, both of Liverpool, N.Y.

[73] Assignee: General Electric Company, Syracuse, N.Y.

[21] Appl. No.: 25,870

[22] Filed: Apr. 2, 1979

Related U.S. Application Data

[63] Continuation of Ser. No. 828,028, Aug. 26, 1977, abandoned.

[51] Int. Cl.³ ............................................. H01L 29/74
[52] U.S. Cl. ....................................... 357/21; 357/52; 357/64; 357/88; 357/96; 357/91
[58] Field of Search ................... 357/21, 52, 64, 88, 357/90, 91

[56] References Cited

U.S. PATENT DOCUMENTS 3,911,463 10/1975 Hull et al. ............................ 357/21
4,056,408 11/1977 Bartko et al. ....................... 357/91

Primary Examiner—Edward J. Wojciechowicz
Attorney, Agent, or Firm—S. B. Salai; R. J. Mooney

[57] ABSTRACT

An improved unijunction transistor having increased valley current is characterized by a region of locally lower lifetime proximate the emitter-base junction. The lifetime is reduced either by overall irradiation of the device or, more preferably, by selective irradiation of the junction area alone.

3 Claims, 5 Drawing Figures

CONTROL OF VALLEY CURRENT IN A UNIJUNCTION TRANSISTOR BY ELECTRON IRRADIATION

This is a continuation of application Ser. No. 828,028, filed Aug. 26, 1977, now abandoned.

This invention relates in general to unijunction transistors and more particularly to a method for increasing the valley current of a unijunction transistor.

Unijunction transistors are useful in a variety of applications including oscillators and as triggers for selectively energizing higher power devices. The unijunction transistor characteristics include a negative resistance region, the extent of which is defined by a peak point and a valley point. The utility of unijunction transistors may oftentimes be increased by increasing the load current that the unijunction transistors are capable of carrying without "latching"; a unijunction transistor continues to operate in the negative resistance region and does not latch into saturation until the valley current is exceeded. Therefore, one measure of the amount of load current that may be carried by a unijunction transistor is the valley current $(I_V)$ characteristic of the device. Generally, the greater the valley current, the greater the load current that may be carried without latching. For a more complete discussion of the characteristics of unijunction transistors and of their applications, reference may be made to the *GE TRANSISTOR MANUAL*, 7th Revised Edition, 1969.

Conventionally, the valley current and other characteristics of unijunction transistors have been established by the geometry of the device. In order to obtain devices having differing selected characteristics, it has been necessary to provide physically distinct devices. Further, the various characteristics of unijunction transistors are not independent but in fact are related to each other. For example, as is known to those skilled in the art, the valley current may be expressed in terms of certain other device parameters as:

$$I_V = \frac{V_{BB}}{R_{B2}} \times \frac{1}{\gamma(\mu n/\mu p + 1) - 1} \qquad \text{EQUATION I}$$

where $V_{BB}$ is the interbase voltage, $R_{B2}$ is the interbase resistance between the emitter and base 2, $\gamma$ is the emitter injection efficiency and $\mu n$ and $\mu p$ are the carrier mobilities of electrons and holes, respectively. It will be appreciated by reference to the foregoing equation that $I_V$ may be increased by decreasing $R_{B2}$, the interbase resistance. As $R_{B2}$ decreases, however, the intrinsic stand-off ratio, Eta ($\eta$) which, as is known in the art, is related to the interbase resistance according to the following relationship, $$\eta = \frac{R_{B2}}{R_{B1} + R_{B2}} \qquad \text{EQUATION II}$$

and, which is preferably below about 0.9 for satisfactory devices in most applications, increases. This requirement on Eta, in effect, imposes a limit on the increase in $I_V$ which may be obtained by decreasing $R_{B2}$. Additionally, decreasing $R_{B2}$, undesirably increases the leakage current of the device tending to degrade it for most purposes. Accordingly, lowering the interbase resistance of the unijunction transistor accomplishes, to some degree, an increase in valley current, but it is not effective either for large changes or in applications where $R_{B2}$ is an important characteristic for other reasons. Similarly, valley current may be improved by increasing the spacing between base 1 of the unijunction transistor and the emitter. This, however, tends to degrade Eta where the spacing becomes too great and is an undesirable method for providing varying characteristics insofar as manufacturing is concerned since physically distinct devices are required at increased cost over a standard (physically) device having subsequently modified characteristics where they are required.

Accordingly, it is an object of this invention to provide a unijunction transistor having increased valley current without any substantial corresponding degradation of related parameters.

It is another object of this invention to provide an improved unijunction transistor wherein the valley current may be adjusted after the device is substantially formed so that a selective increase may be provided where needed; while devices which, for other reasons, are produced having acceptable valley current will not need to be modified.

It is yet another object of this invention to provide a method for increasing the valley current of a unijunction transistor which is both inexpensive to perform and readily adapted to be used in conjunction with existing unijunction fabrication techniques.

Briefly stated and in accordance with one aspect of this invention, a unijunction transistor is provided having a region of reduced lifetime at least including the emitter of the transistor. Reduced lifetime is provided in accordance with one embodiment of the invention by irradiating essentially the entire device with lattice-damage causing radiation which may preferably be electron irradiation. In accordance with another preferred embodiment of the invention, selective irradiation is employed to reduce the lifetime essentially only in the area of the transistor including the emitter. A transistor in accordance with the teachings of this invention may conveniently be provided, at low cost, which has increased valley current as compared with prior art transistors.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
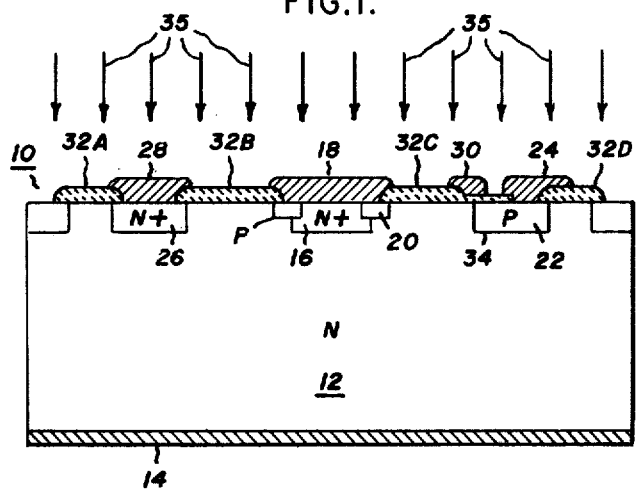
FIG. 1 is a section view of a planar unijunction transistor illustrating irradiation thereof in accordance with one aspect of this invention.

FIG. 1 is a section view of a planar unijunction transistor of the type which may be advantageously irradiated in accordance with the teaching of this invention. The unijunction transistor indicated generally at 10 includes a body portion 12 which may conveniently be fabricated of N-type semiconductor material as, for example, N-conductivity type silicon. Body 12 includes first ohmic contact 14 thereto which forms, in accordance with conventional nomenclature the second base, B2 of the unijunction transistor. High conductivity region 16 forms the base-1 contact region of the unijunction transistor and is conventionally of N+ conductivity type silicon, contact being made thereto through electrode 18 which is a metal electrode and ohmic contact to N+ conductivity type region 16. P-conductivity type region 20 surrounds base 1 region 16 and functions to precisely limit the extent of base 1 and allow exact control over the base 1-emitter spacing. It should be appreciated that while p-conductivity type region 20 is included in the exemplary unijunction transistor of this invention as illustrating the current state of the art, it forms no particular part of this invention. P-conductivity type region 22 comprises the emitter of the unijunction transistor and is provided with electrode 24 in ohmic contact therewith for attachment of an emitter connection. P-conductivity type region 22 forms a junction with N-type body 12. N+ conductivity type region 26 contacts N-type body 12 and together with electrodes 28 and 30 form a field relief element. While electrodes 28 and 30 are illustrated herein as separate electrodes which may conveniently be connected by well known means, it may oftentimes be preferred to form a single electrode contacting N+ region 26 and extending between emitter 22 and base-1 16. Electrode 30 assumes the potential of base-2 electrode 14 and prevents inversion of the surface of body 12 between the emitter and base 1, thus limiting spreading and further contributing to accurate control of the base-1 emitter spacing. As was stated with respect to P-type region 20, N+ type region 26 and electrodes 28/30 are included in this preferred embodiment of the invention to conform to the current state of the art, and, may be omitted, if desired.

Oxide layers 32A–D are conveniently utilized in the formation by masked diffusion of unijunction transistor 10. The unijunction transistor illustrated in FIG. 1 and described above is a state of the art planar unijunction transistor.

The irradiation of semiconductors with lattice-damage-causing particles is well known in the art. While any of a number of types of radiation as has been suggested in innumerable prior patents and in the literature may be employed in accordance with this invention, so long as lifetime-reducing lattice damage occurs, this invention prefers the use of high energy electron irradiation.

In accordance with this invention, variation or control of $I_V$ is obtained by treating the device with radiation. Irradiation is performed from the top of the device as indicated by arrows 35. In accordance with one embodiment of this invention, the desired irradiation may be directed at essentially the entire device and may thus conveniently be accomplished after the manufacture of the device is substantially completed and all the elements as have hereinabove been described are in place. A radiation source is employed which will provide adequate penetration of, for example, electrodes 28, 18, and 24 as well as electrode 30. Reference to the foregoing relation (eq. 1) between valley current and other device parameters illustrates that the valley current in a unijunction transistor is approximately inversely proportional to the hole injection efficiency ($\gamma$) from the emitter to base 1 and is also inversely proportional to the total resistance between the two base terminals ($R_{bb}$). Irradiation of a unijunction transistor as illustrated at FIG. 1 decreases the hole injection efficiency as a result of the increase in recombination centers in the area of the emitter-base junction 34. The effects of this consequent carrier removal in the base are twofold. For a relatively slight decrease in lifetime, the carrier removal effect which affects the resistance of the device in the base region is small and valley current will increase as $\gamma$ decreases. When the density of carrier removal sites, induced by the reduction of lifetime caused by irradiation, approaches the base impurity concentration, the resistance between the two base terminals increases rapidly and, in fact, becomes a substantially more significant effect than the lifetime in the base emitter junction region causing the overall valley current to decrease.

Figure 2:
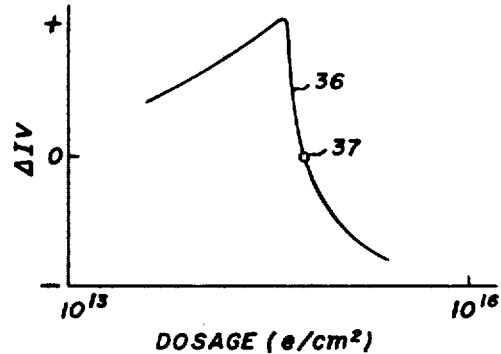
FIG. 2 is a graphical representation of the relation between the irradiation dosage and the change in valley current in accordance with this invention.

Reference to FIG. 2 shows graphically the effects of increasing radiation dosage on valley current. Dosages between about $10^{13}$ and about $10^{16}$ e/cm$^2$ are included in the graphical representation of FIG. 2. During a first portion of curve 26, increasing dosage results in increasing valley current as is oftentimes desired. Above a critical dosage level 37, however, valley current decreases rapidly with increasing dosage. It is expected that the particular value of the critical dosage illustrated at FIG. 2 may be determined experimentally for a particular unijunction transistor structure and will depend upon the geometry and other physical and electrical characteristics of the particular device. In accordance with an exemplary embodiment of this invention, it has been determined that the critical dosage for a particular unijunction transistor irradiated in accordance with the foregoing teachings is between $10^{14}$ and $10^{15}$ e/cm$^2$. For this particular unijunction transistor, the base resistivity is about 100 ohm-centimeter and the peak valley current is achieved at about $2 \times 10^{14}$ e/cm$^2$.

Figure 3:
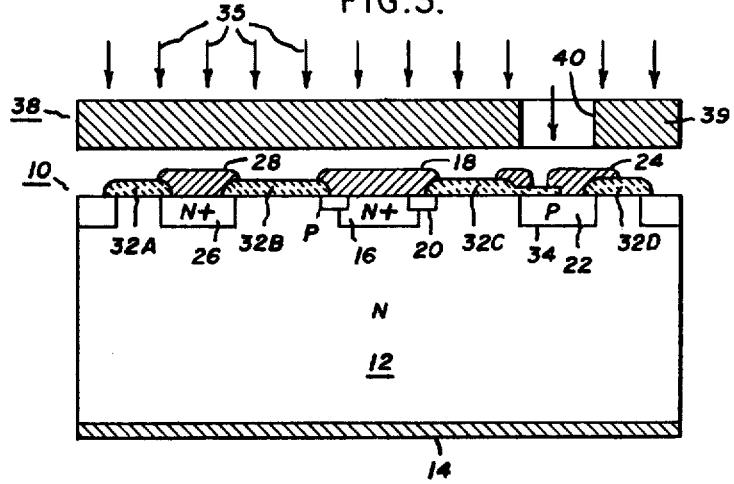
FIG. 3 is a cross section view of the selective irradiation of a planar unijunction transistor in accordance with another embodiment of this invention.

While overall irradiation of a unijunction transistor as described hereinabove provides a new and useful method for modifying the characteristics of unijunction transistors, certain additional advantages may be obtained by selectively irradiating only portions of the device. Referring to FIG. 3, there is illustrated in accordance with a preferred embodiment of this invention, a planar unijunction transistor of the type illustrated in FIG. 1 along with a mask for accomplishing the selective irradiation of essentially only the emitter region of the transistor. Like elements to those of FIG. 1 are referred to in FIG. 3 with like reference numerals. Mask 38 is characterized by a relatively thick cross section characterized by reducing the energies of electrons impacting thereon and which pass therethrough to a level such that essentially no lattice damage is caused in a semiconductor material relative to that caused by electrons passing through aperture 40 in mask 38. While mask 38 is illustrated as having a radiation transparent or transmitting region 40 therein which is essentially an opening, it will be understood by those skilled in the art that where desired, region 40 may be formed by a groove or the like providing a substantially thinner layer of metal interposed between the radiation source and transistor 10 than in the radiation-opaque or masking portions 39 of mask 38. It will be understood by those skilled in the art that the efficacy of irradiation masking is determined by the difference in energies of high energy particles impacting in the masked and unmasked areas. In accordance with the teachings of this invention, mask 38 is selected to be of a material and a thickness thereof sufficient to insure that in the masked areas essentially no particles impinge upon unijunction transistor 10 having energies sufficient to reduce the lifetime of the semiconductor material. For example, it has been found that where the energy of particles, and especially of electrons, is reduced to about 300 KeV, substantially elastic collisions take place and damage to the lattice caused by irradiation is slight. Similarly, where electrons having energies in excess of about 400 KeV impact the semiconductor device, the desired lattice damaging effects of irradiation are obtained. Mask 38 is preferably designed therefore to achieve a reduction in energy of at least 100 KeV. Masks having reductions in energy of high energy particles passing therethrough of 200 KeV are conveniently formed of molybdenum having a thickness of 6 mils. Masks of this type are readily formed having apertures therein by conventional manufacturing techniques as, for example, chemical etching.

In accordance with a presently preferred embodiment of this invention, aperture 40 is essentially coextensive with P type emitter region 22. This insures that the effects of irradiation occur essentially only in the emitter region of the device.

Irradiation in accordance with FIG. 3 has some advantage over overall irradiation in accordance with FIG. 1. For example, as has been described, even those dosages below the critical value when the valley current begins to decrease, produce some degradation of $\gamma$ as a result of the increase in interbase resistance, $R_{B2}$. Similarly, a degradation in $V_{Esat}$, the emitter saturation voltage, occurs as a result of overall irradiation. Selective irradiation in accordance with FIG. 3 essentially eliminates the tradeoff between $I_V$ and $V_{Esat}$ and minimizes the carrier removal effect thereby minimizing the change in $R_{B2}$.

Figure 4:
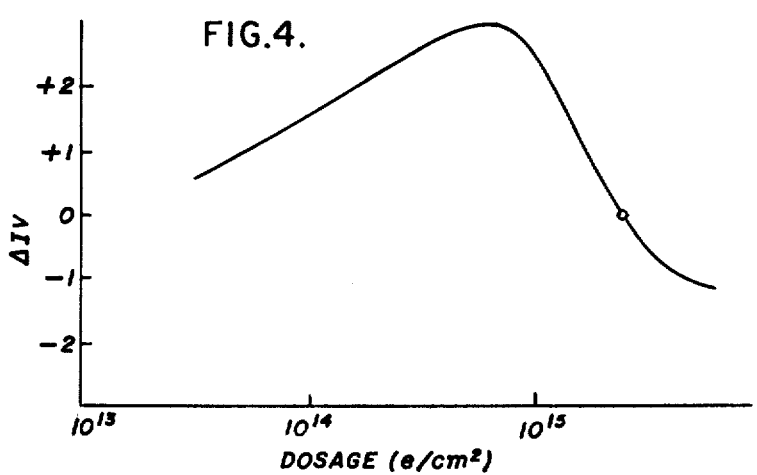
FIG. 4 is a graphical representation of the relation between the irradiation dosage and the change in valley current for a selectively irradiated unijunction transistor in accordance with this invention.

FIG. 4 is a graphical representation of the same parameters as are illustrated in FIG. 2 for a unijunction transistor which is selectively irradiated as has been described. It will be noted that the increase in valley current obtainable is higher since the maximum dosage above which valey current begins to reduce is increased.

Figure 5:
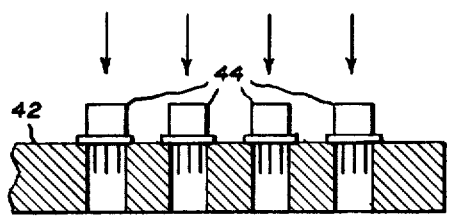
FIG. 5 is a sectional plan view of a fixture for irradiating a plurality of unijunction transistors after the packaging thereof, for example, in metal cans.

The irradiation of planar unijunction transistors in accordance with this invention may be accomplished either while the transistors are in the form of pellets as part of a larger semiconductor wafer as is a presently preferred manufacturing process, or as finished devices as is illustrated at FIG. 5. Where devices are desired to be irradiated while still in wafer form, a mask is provided which essentially duplicates the characteristics of mask 38 for each of a large number of individual unijunction transistor devices. Selective irradiation may thereby be accomplished for many devices with a single exposure to a radiation source. Where devices are desired to be radiated after they have been more fully completed, up to and including the time when they are enclosed in, for example, a metal container such as a TO-type package, they may be placed in a fixture of a type illustrated in FIG. 5 so that a number of devices may be simultaneously irradiated. It will be appreciated that fixture 42 is not necessarily a fixture of a material which masks radiation but rather it is of a type characterized by the ability to support transistors 44 in a radiation environment in which, preferably therefor, should not be adversely affected by the impact of radiation thereon.

In accordance with an example of the application of this invention to a planar unijunction device, Table I presents the change in various device parameters for a unijunction transistor irradiated to a dosage of about $2 \times 10^{14}$ e/cm$^2$. The device is characterized by a 100 ohm-cm. phosphorous doped silicon base material.

TABLE I

| CHANGE IN PARAMETER AFTER BOMBARDMENT | |
|---|---|
| $I_v$ | +18% |
| $R_{BB}$ | +4% |
| Eta | −2.6% |
| $V_{Esat}$ | +9% |
| $I_{B2MOD}$ | −40% |
| $I_p$ | +5% |
| $I_{EO}$ | +(.015→.125na.) |
| $V_{OB1}$ | −5% |

$I_V$ is the valley current, $R_{BB}$ is the interbase resistance, Eta is the intrinsic standoff ratio, $V_{Esat}$ is the emitter saturation voltage, $I_{B2MOD}$ is the interbase modulated current, $I_p$ is the peak point current, $I_{EO}$ is the emitter reverse current, and $V_{OB1}$ is the base 1 peak pulse voltage.

More complete definitions of the foregoing parameters may be found by reference to the *General Electric Transistor Manual*, supra, especially to Chapter 13 thereof, entitled, "Unijunction Transistor Circuits."

In accordance with the teachings of this invention, the stability of unijunction transistors irradiated as described hereinabove may be enhanced by annealing the devices after irradiation. Annealing is benefically accomplished at a temperature in the range of about 200° to 400° C. for a time of between about a few minutes and 100 hours. Preferably, annealing may be carried out at a temperature of about 300° C. for between about two and about three hours.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. An improved unijunction transistor comprising:
   a body of semiconductor material of a first conductivity type characterized by a first lifetime;
   first and second spaced apart base electrodes on said body;
   a region in said body of semiconductor material of a conductivity type opposite said first conductivity type for controlling current flow between said first and second base electrodes, said region forming a p-n junction with said body;
   at least a portion of said region of opposite conductivity type proximate said junction having a lower lifetime than said first lifetime.

2. The unijunction transistor of claim 1 wherein said region of conductivity type opposite said first conductivity type comprises the emitter of said unijunction transistor.

3. The unijunction transistor of claim 2 wherein the region including said emitter and at least a portion of said body of semiconductor material surrounding said emitter is characterized by said lower lifetime.

* * * * *